US010521297B2

(12) United States Patent
Nakata et al.

(10) Patent No.: US 10,521,297 B2
(45) Date of Patent: Dec. 31, 2019

(54) OPTICAL DISC APPARATUS AND OPTICAL DISC IN WHICH USER DATA IS RECORDED IN A FIRST SPACE IN UNITS OF A FIRST LENGTH AND MANAGEMENT INFORMATION IS RECORDED IN A SECOND SPACE IN UNITS OF A SECOND LENGTH DIFFERENT FROM THE FIRST LENGTH

(71) Applicant: Panasonic Intellectual Property Management Co., Ltd., Osaka (JP)

(72) Inventors: Kohei Nakata, Nara (JP); Yuji Takagi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/355,735

(22) Filed: Nov. 18, 2016

(65) Prior Publication Data
US 2017/0262338 A1    Sep. 14, 2017

(30) Foreign Application Priority Data
Mar. 10, 2016  (JP) .................. 2016-046422

(51) Int. Cl.
*G06F 11/10* (2006.01)
*H03M 13/29* (2006.01)
(Continued)

(52) U.S. Cl.
CPC .......... *G06F 11/1076* (2013.01); *G06F 3/064* (2013.01); *G06F 3/0619* (2013.01);
(Continued)

(58) Field of Classification Search
CPC ...... G06F 11/08; G06F 11/10; G06F 11/1004; G06F 11/1076; G06F 3/06; G06F 3/0614;
(Continued)

(56) References Cited

U.S. PATENT DOCUMENTS 7,111,222 B2 * 9/2006 Takagi ............... G11B 20/1803
714/755
7,355,936 B2   4/2008 Senshu
(Continued)

FOREIGN PATENT DOCUMENTS

WO       2004/012190        2/2004

OTHER PUBLICATIONS

Office Action dated Apr. 18, 2018 in U.S. Appl. No. 15/864,161.

*Primary Examiner* — Kyle Vallecillo
(74) *Attorney, Agent, or Firm* — Wenderoth, Lind & Ponack, L.L.P.

(57) ABSTRACT

In an optical disc apparatus that records and reproduces data onto and from an optical disc in units of predetermined block, an information divider divides the data so as to reduce an amount of the data included in each of blocks when a recording state of the optical disc does not satisfy a predetermined criterion, and reproduces recording data in units of the block by adding sub-information including a value indicating the amount of the data included in each of the blocks. An error-correction encoder circuit encodes the recording data in a first error-correction code format, and a recorder converts encoded recording data into a recording signal, and records the recording signal onto the optical disc. A quality evaluator circuit produces an evaluation value indicating a recording quality based on a result of reproducing the recording signal recorded on the optical disc.

4 Claims, 7 Drawing Sheets

(51) Int. Cl.
*H03M 13/15* (2006.01)
*H03M 13/35* (2006.01)
*H03M 13/19* (2006.01)
*H03M 13/00* (2006.01)
*G11B 20/10* (2006.01)
*G11B 20/12* (2006.01)
*G11B 20/18* (2006.01)
*G06F 3/06* (2006.01)
*G11B 7/005* (2006.01)

(52) U.S. Cl.
CPC ............ *G06F 3/0677* (2013.01); *G11B 7/005* (2013.01); *G11B 20/10305* (2013.01); *G11B 20/10361* (2013.01); *G11B 20/1217* (2013.01); *G11B 20/1833* (2013.01); *H03M 13/19* (2013.01); *H03M 13/2909* (2013.01); *H03M 13/2948* (2013.01); *H03M 13/35* (2013.01); *H03M 13/618* (2013.01); *G11B 2020/1853* (2013.01); *H03M 13/1515* (2013.01)

(58) Field of Classification Search
CPC ...... G06F 3/0619; G06F 3/064; G06F 3/0677; G11B 7/0045; G11B 7/005; G11B 20/10; G11B 20/12; G11B 20/1217; G11B 20/18; G11B 20/1816; G11B 20/1823; G11B 2020/1218; G11B 2020/1221; G11B 2020/1222; G11B 2020/1227; G11B 2020/1228; G11B 2020/1241; G11B 2020/1242; G11B 20/10305; G11B 20/10361; G11B 20/1833; G11B 2020/1853; H03M 13/015; H03M 13/05; H03M 13/15; H03M 13/1515; H03M 13/29; H03M 13/2906; H03M 13/2948; H03M 13/35; H03M 13/356; H03M 13/19; H03M 13/2909; H03M 13/618
See application file for complete search history.

(56) References Cited

U.S. PATENT DOCUMENTS

| | | | |
|---|---|---|---|
| 7,685,494 B1 | 3/2010 | Varnica et al. | |
| 2005/0018572 A1* | 1/2005 | Gushima | G11B 7/00736 369/53.15 |
| 2005/0086578 A1 | 4/2005 | Saito et al. | |
| 2005/0185547 A1* | 8/2005 | Nagai | G11B 7/00736 369/47.55 |
| 2006/0123283 A1* | 6/2006 | Hwang | G11B 20/1883 714/718 |
| 2007/0297305 A1* | 12/2007 | Nakamura | G06F 3/0619 369/53.17 |
| 2008/0165647 A1* | 7/2008 | Kwon | G11B 7/00736 369/53.17 |
| 2010/0306487 A1* | 12/2010 | Hwang | G11B 20/1883 711/162 |
| 2011/0252289 A1 | 10/2011 | Patapoutian et al. | |
| 2012/0155236 A1* | 6/2012 | Hwang | G11B 7/00736 369/47.27 |
| 2012/0307612 A1* | 12/2012 | Nishimura | G11B 7/00736 369/47.15 |
| 2013/0003522 A1* | 1/2013 | Akahoshi | G11B 19/041 369/275.1 |
| 2014/0098654 A1* | 4/2014 | Hoshizawa | G11B 19/122 369/30.03 |

* cited by examiner

OPTICAL DISC APPARATUS AND OPTICAL DISC IN WHICH USER DATA IS RECORDED IN A FIRST SPACE IN UNITS OF A FIRST LENGTH AND MANAGEMENT INFORMATION IS RECORDED IN A SECOND SPACE IN UNITS OF A SECOND LENGTH DIFFERENT FROM THE FIRST LENGTH

CROSS-REFERENCE TO RELATED APPLICATION

This is an application, which claims priority to Japanese patent application No. JP 2016-046422 as filed on Mar. 10, 2016, the contents of which are incorporated herein by reference.

BACKGROUND OF THE DISCLOSURE

1. Field of the Disclosure

This disclosure relates to an optical disc apparatus that records and reproduces data onto and from an optical disc, and relates to an optical disc onto which data is optically recorded.

2. Description of the Related Art

Many types of optical discs such as a DVD, a Blu-ray (a registered trademark) disc (hereinafter, referred to as a BD) are currently used as information recording media each for storing a video image, data, or the like. From the viewpoint of space efficiency for storing the data, a technique to improve the track density and a technique to improve the line density are present as techniques each to improve the recording capacity per volume without increasing the cost of the optical disc. It has been known for an optical disc that error-correction is executed in units of a predetermined block (See Patent Document 1, for example).

Improvement of the storage density can be facilitated to improve the recording capacity of an optical disc. However, the number of bit errors occurring during reproduction is also increased associated with the improvement of the density, and therefore, an error correcting code technique having improved error-correction capability has been proposed.

PRIOR ART DOCUMENT

Patent Document

Patent Document 1: WO 2004/012190 A1

SUMMARY OF THE DISCLOSURE

The present disclosure provides an optical disc apparatus capable of stably reproducing data recorded on an optical disc having an increased density.

According to one aspect of the present disclosure, there is provided an optical disc apparatus that records and reproduces data onto and from an optical disc in units of predetermined block. The optical disc apparatus includes an information divider, an error-correction encoder circuit, a recorder, and a quality evaluator circuit. The information divider divides the data so as to reduce an amount of the data included in each of blocks when a recording state of the optical disc does not satisfy a predetermined criterion, and reproduces recording data in units of the block by adding sub-information including a value indicating the amount of the data included in each of the blocks. The error-correction encoder circuit encodes the recording data in a first error-correction code format. The recorder converts encoded recording data into a recording signal, and records the recording signal onto the optical disc. The quality evaluator circuit produces an evaluation value indicating a recording quality based on a result of reproducing the recording signal recorded on the optical disc.

The present disclosure provided the optical disc apparatus capable of stably reproducing data recorded on an optical disc having an increased density.

DETAILED DESCRIPTION OF THE EMBODIMENTS

One non-limiting and exemplary embodiment will be described below in detail with reference to the drawings as appropriate. It is noted that no detailed description beyond necessity may be made. For example, no detailed description of items already known well and no redundant description for substantially same configurations may be made. This is to avoid any unnecessary redundancy in the following description and to facilitate understanding of those skilled in the art.

The accompanying drawings and the following description are provided for those skilled in the art to fully understand the present disclosure, and then, any limitation is not intended for the subject matter described in claims.

Non-Limiting and Exemplatory Embodiment

1. Configuration

Figure 1:
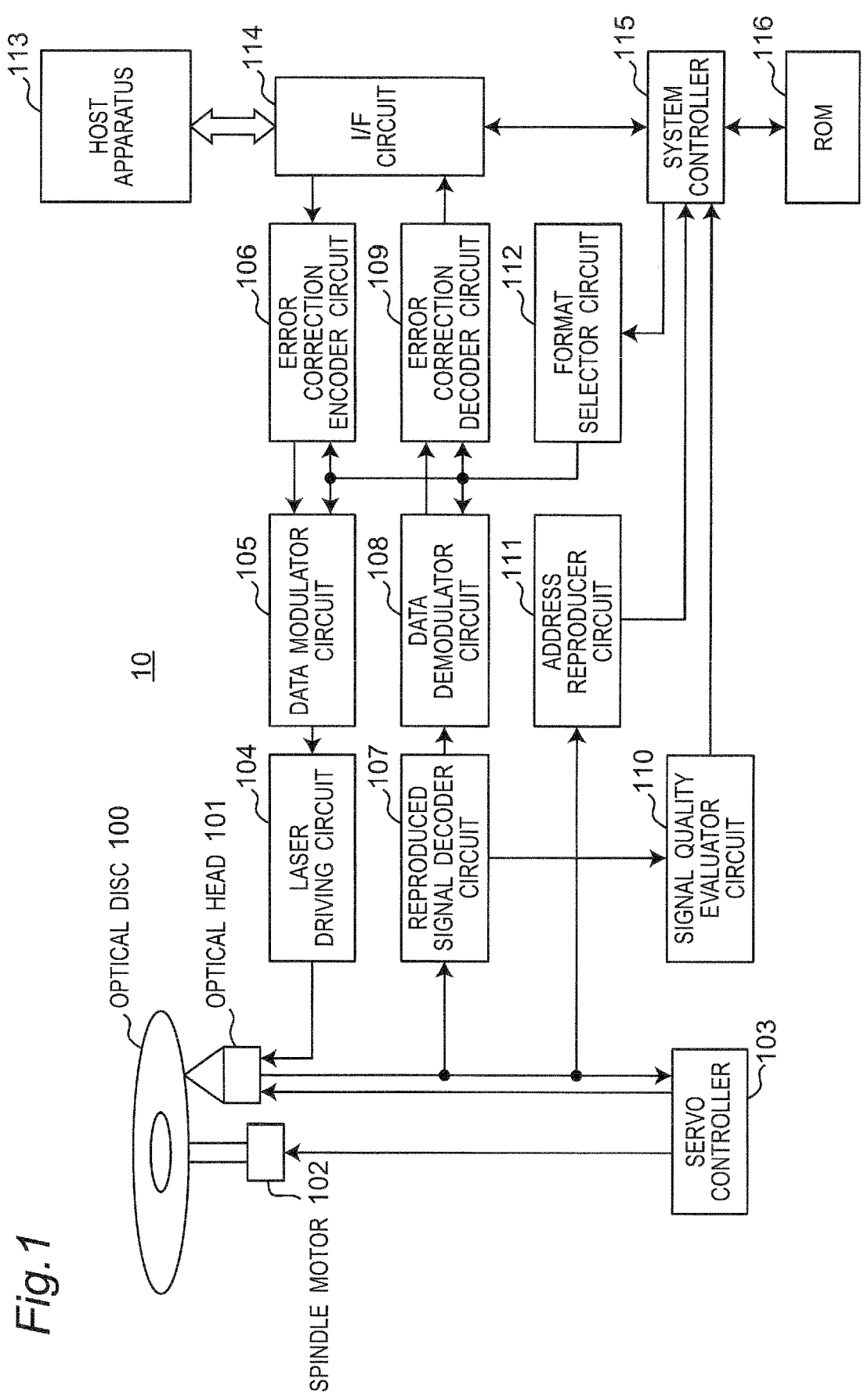
FIG. 1 is a block diagram of a configuration of an optical disc apparatus 10 according to an embodiment.

FIG. 1 is a block diagram of a configuration of an optical disc apparatus 10 according to the present embodiment. Referring to FIG. 1, the optical disc apparatus 10 includes an optical head 101, a spindle motor 102, a servo controller 103, a laser driving circuit 104, a data modulator circuit 105, an error-correction encoder circuit 106, a reproduced signal decoder circuit 107, a data demodulator circuit 108, an error-correction decoder circuit 109, a signal quality evaluator circuit 110, an address reproducer circuit 111, a format selector circuit 112, a system controller 115, an interface circuit (hereinafter, referred to as an I/F circuit) 114, and a read only memory (ROM) 116.

The optical disc apparatus 10 records and reproduces user data onto and from an optical disc 100. On the optical disc 100, a track is disposed in a spiral shape from an inner circumference thereof to the outer circumference thereof. The track includes a groove track formed by a groove and a land track formed between the adjacent groove tracks. The user data is recorded on both of the groove track and the land track.

The spindle motor 102 rotates the optical disc 100. The optical head 101 irradiates a light beam to the optical disc 100, to record user data onto the optical disc 100 and reproduce the user data from the optical disc 100.

The servo controller 103 controls the optical head 101 and the spindle motor 102 to condense the light beam irradiated from the optical head 101 to the optical disc 100 on the track disposed on the optical disc 100, to scan the condensed light beam thereon. Then, the servo controller 103 controls the optical head to move so as to access a target track. The servo controller 103 controls the position of the optical head 101 and the rotation number of the spindle motor 102 for the optical head 101 to scan the optical disc 100 at a predetermined line velocity.

The I/F circuit 114 receives user data to be recorded on the optical disc 100, from a host apparatus 113. The I/F circuit 114 sends user data reproduced from the optical disc 100, to the host apparatus 113.

The error-correction encoder circuit 106 adds a parity for error-correction, to the user data received from the I/F circuit 114 to form encoded data.

The data modulator circuit 105 produces a modulated signal by modulating a predetermined pulse signal using a predetermined modulation rule according to the encoded data including the parity sent from the error-correction encoder circuit 106. The encoded data of this modulated signal is recorded in the track on the optical disc 100.

The laser driving circuit 104 converts the modulated signal into an optical pulse to accurately form a mark on the optical disc 100, and drives a laser of the optical head 101 according to the converted optical pulse. The mark is formed on the optical disc 100 by the heat of the irradiated laser.

On the other hand, the user data recorded on the optical disc 100 is reproduced by the reproduced signal decoder circuit 107, the data demodulator circuit 108, and the error-correction decoder circuit 109.

The optical head 101 irradiates the light beam to the optical disc 100, and then, detects a reflected light beam from the optical disc 100. The optical head 101 reproduces a reproduced signal based on the detected reflected light beam, and outputs the reproduced signal.

The reproduced signal decoder circuit 107 decodes the reproduced signal outputted by the optical head 101 to produce a decoded signal. For example, this is realized by a PRML signal processing technique according to which an expected value waveform closest to the reproduced signal is selected from the comparison between the reproduced signal and expected value waveforms, and a binary signal to be the source of the expected value waveform is outputted as the decoded signal. The reproduction performance when handling a higher line density can be acquired by employing the condition under which the width of an inter-symbol interference is set to be longer than a predetermined width.

The data demodulator circuit 108 demodulates the encoded data from the decoded signal using a predetermined modulation rule.

The error-correction decoder circuit 109 corrects errors in the demodulated encoded data to recover the user data.

The signal quality evaluator circuit 110 measures the quality such as distortion and amplitude dispersion of the reproduced signal and the like based on the result of the decoding of the decoded signal by the reproduced signal decoder circuit 107. A maximum likelihood sequential error (MLSE) index is used as a signal quality evaluation technique that handles the PRML signal processing technique. The MLSE index quantitatively evaluates the magnitude of the error between the reproduced signal and the expected value waveform. The recording condition of the mark recorded on the track of the optical disc 100 can be evaluated by the MLSE index.

The address reproducer circuit 111 reproduces address information from a warble signal corresponding to the meandering of the track of the optical disk 100 detected by the optical head 101, and then, outputs the reproduced address information. The track of the optical disc 100 is formed with meandering at predetermined periods, and the address information is included therein for the position of the track to be known by modulating the predetermined period.

The format selector circuit 112 selects the error-correction format of the encoded data to be recorded on the track of the optical disc 100. The error-correction encoder circuit 106 and the error-correction decoder circuit 109 operate according to the selected error-correction format.

The ROM 116 includes a flash memory. The ROM 116 has a program stored therein in advance, which is executed by the system controller 115 to control the overall optical disc apparatus 10.

The system controller 115 controls each of the circuits and controls the communication with the host apparatus 113, by reading out and executing the program stored in the ROM 116. In FIG. 1, for convenience, no arrow is shown to indicate the control for the constituent elements other than the system controller 115 to the format selector circuit 112. The system controller 115 of the optical disc apparatus 10 according to the present embodiment determines a space on the optical disc 100 from the address information outputted by the address reproducer circuit 111, and controls the format selector circuit 112 to record the encoded data in an error-correction format corresponding to the space. The system controller 115 also determines the state of degradation of the optical disc 100 based on the state of the recording of the mark evaluated by the signal quality evaluator circuit 110, and determines the amount of recording data to be included in units of the block of the error-correction format.

Figure 2:
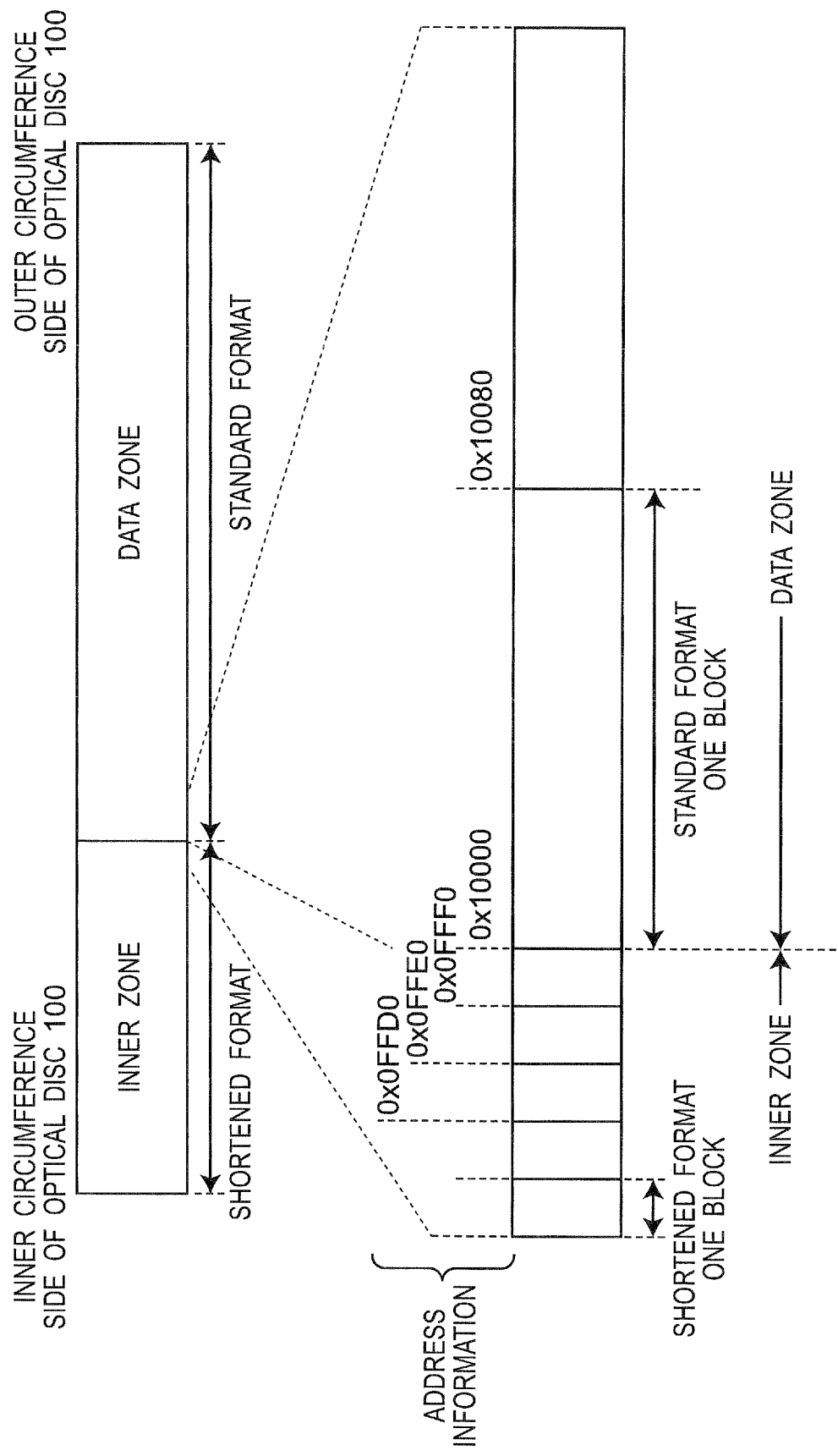
FIG. 2 is a format diagram of a configuration of a space format of an optical disc 100 used in the optical disc apparatus 10 of FIG. 1.

FIG. 2 is a format diagram of a configuration of a space format of the optical disc 100 used in the optical disc apparatus 10 of FIG. 1. Referring to FIG. 2, on the inner circumference side of the optical disc 100, an inner zone is disposed that has management information and the like recorded therein to manage the use status and the like of the track of the optical disc 100. In the rest of the space of the optical disc 100, a data zone is disposed to record therein the user data transmitted from the host apparatus 113. In the data zone of the optical disc 100, a standard format is used as the encoding format and, in the inner zone thereof, a shortened format is used. The system controller 115 controls the format selector circuit 112 to switch the encoding format corresponding to whether the space for the recording is the data zone or the inner zone.

Figure 3:
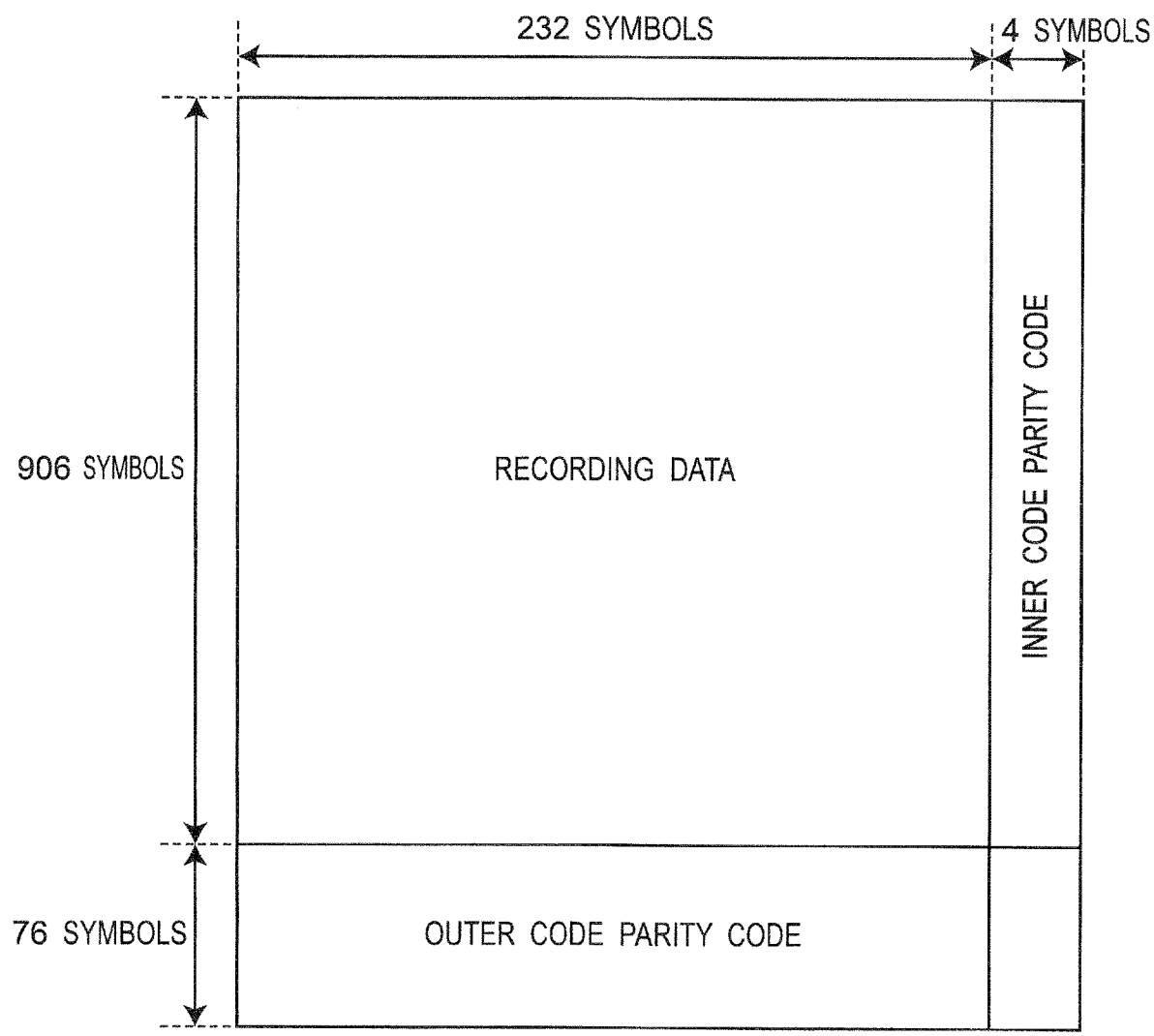
FIG. 3 is a format diagram of a configuration of a standard format used in encoding executed in units of a data block by an error-correction encoder circuit 106 of FIG. 1.

FIG. 3 is a format diagram of a configuration of the standard format used in encoding in units of the data block by the error-correction encoder circuit 106 of FIG. 1. A Reed-Solomon iterated code using 10 bits as one symbol is used as the error-correction code. An inner code adds an inner code parity code of four symbols to 232 symbols of the recording data. The number of inner codes per one data block is 906+76=982. An outer code adds an outer code parity code of 76 symbols to 906 symbols of the recording data. The number of outer codes per one data block is 232+4=236. One data block includes the recording data of 906×232=210,192 symbols, that is, 210,192 (symbols)×10 (bits)/8 (bits)=262,740 bytes. In the error-correction encoder circuit 106, the user data transmitted from the host apparatus 113 is added with an error detection parity code of four bytes for each 2,048 bytes to include 2,052 bytes. 128 sets of these 2,052 bites become 262,656 bytes. The recording data of 262,740 bytes in total is formed by further adding thereto 84 bytes of the control data such as the address information indicating the position to be recorded at, and the like, added with an error-correction parity code for the control data (an error-correction parity code for executing error-correction for the control data). The recording data of these 262,740 bytes is encoded according to the format of the Reed-Solomon iterated code to be the encoded data. The control data is an example of sub-information, and the sub-information includes the control data and the error-correction parity code for the control data.

Figure 4:
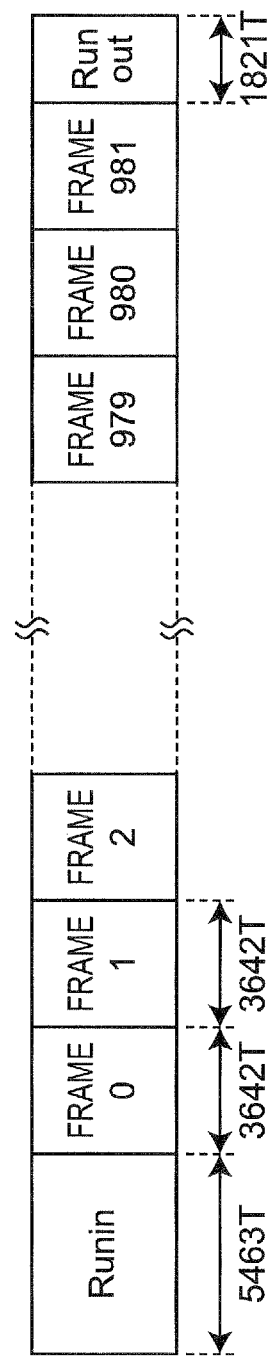
FIG. 4 is a format diagram of a configuration of a recording format that corresponds to the standard format of FIG. 3.

FIG. 4 is a format diagram of a configuration of a recording format of a modulated signal in units of the data block by the data modulator circuit 105 for the standard format of FIG. 3. Referring to FIG. 4, the encoded data that is error-correction-encoded is modulated using one code of the inner codes of the Reed-Solomon iterated code format shown in FIG. 3 as one frame and using a run-length limited (RLL) (1, 10) modulation rule. A synchronization pattern using 12T not included in the modulation rule is added at the head of the frame. In this case, T denotes a reference period of the modulation. In order to avoid inclusion of any lower component in the frequency property of the modulated signal, a DC control bit equalizing the ratios of the mark and the space is inserted at predetermined intervals, and the length of the one frame is 3,642T. The number of frames is equal to the number of inner codes and is 982 frames. A run-in having a length of 5,463T is added at the head of the data block, and a run-out having a length of 1,821T is added at the end terminal. The "Run-in" is a space used for control of the amplitude of the reproduced signal and the like, such that the reproduced signal decoder circuit 107 can execute stable signal processing from the head of the frame 0. The "Run-out" is a buffer space to avoid any overlapping of the data blocks and generation of any void therebetween when the succeeding data block is recorded.

Figure 5:
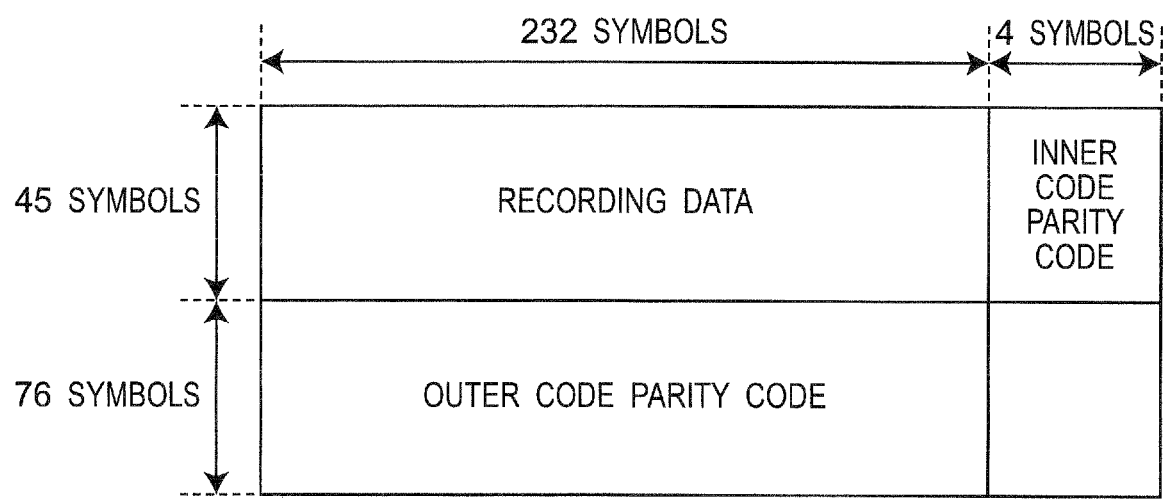
FIG. 5 is a format diagram of a configuration of a shortened format used in encoding executed in units of the data block by the error-correction encoder circuit 106 of FIG. 1.

FIG. 5 is a format diagram of a configuration of a shortened format used in encoding in units of the data block by the error-correction encoder circuit 106 of FIG. 1. Referring to FIG. 5, in a manner similar to that of the standard format, the Reed-Solomon iterated code which uses 10 bits as one symbol is used as the error-correction code. As to the inner code, the inner code parity code of four symbols is added to the recording data of 232 symbols. The number of inner codes per one data block is 45+76=121. As to the outer code, the outer code parity code of 76 symbols is added to the recorded data of 45 symbols. The number of outer code per one data block is 232+4=236. The outer code in the standard format includes 76 symbols of the outer code parity code for 906 symbols of the recording data. On the other hand, the outer code in the shortened format includes 76 symbols of the inner code parity code for 45 symbols of the recording data. Namely, in the shortened format, the inner code is same as that of the standard format. On the other hand, the redundancy degree of the outer code is higher than that of the standard format. Therefore, the recording data is small, but the error-correction capability of the outer code is very high.

One data block includes 232×45=10,440 symbols, that is, the recording data of 13,050 bytes. In the inner zone, the system controller 115 sends the management information and the like to manage the status of the use of the track of the optical disc 100 to the error-correction encoder circuit 106 through the I/F circuit 114. In the error-correction encoder circuit 106, an error detection parity code of four bytes is added to each 2,048 bytes to be 2,052 bytes. Six sets of these 2,052 bytes become 12,312 bytes. The recording data of 13,050 bytes in total is formed by further adding thereto 738 bytes formed by adding the control data such as the address information indicating the position to be recorded at, and the like, and the error-correction parity code for the control data. The recording data of these 13,050 bytes is encoded according to the shortened format of the Reed-Solomon iterated code, to be the encoded data.

Figure 6:
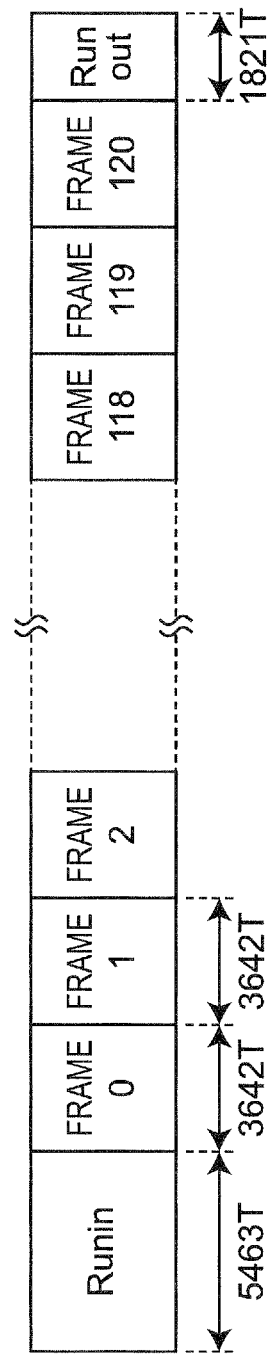
FIG. 6 is a format diagram of a configuration of a recording format that corresponds to the shortened format of FIG. 5.

FIG. 6 is a format diagram of a configuration of a recording format of the modulated signal in units of the data block by the data modulator circuit 105 for the shortened format of FIG. 5. Referring to FIG. 6, the modulated signal is produced by modulating the pulse signal according to the encoded data that is error-correction-encoded, using one code of the inner codes of the shortened format of the Reed-Solomon iterated code shown in FIG. 5 as one frame, and using the RLL (1, 10) modulation rule. The synchronization pattern using 12T not included in the modulation rule is added to the head of the frame. In order to avoid inclusion of any lower component in the frequency property of the modulated signal, a DC control bit equalizing the ratios of the mark and the space is inserted at predetermined intervals and the length of the one frame is 3,642T. The configuration of the one frame is same as that of the standard format. The number of frames is equal to the number of inner codes of the shortened format and is 121 frames. A run-in having a length of 5,463T is added to the head of the data block, and a run-out having a length of 1,821T is added to the end terminal of the data block.

In the standard format and the shortened format, the run-in and the run-out are common thereto, and then, the length thereof is 7,284T in total and corresponds to the length of two frames. Therefore, the length of the data block of the standard format is 3,642T×984 frames, and the length of the data block of the shortened format is 3,642T×123 frames. The length of the data block of the shortened format is 1/8 of the length of the data block of the standard format. As shown in FIG. 2, the address information is added by 0x80 in units of one data block of the standard format, and the address information is added by 0x10 in units of one data block of the shortened format. The length of the data block of each of the recording and the reproduction is switched over between the shortened format of the inner zone and the standard format of the data zone. In this case, the relation is maintained to be constant between the physical position on the track of the optical disc 100 and the address information. When the position is located on the border between the inner zone and the data zone, the system controller 115 can access any data block at an arbitrary position on the optical disc 100 using the address information acquired from the address reproducer circuit 111 without especially executing the switching of the processing conditions and the like.

2. Operation

The operations of the optical disc apparatus 10 of FIG. 1 will be described.

The operation for recording data onto the track of the data zone of the optical disc 100, which is executed by the optical disc apparatus 10 of FIG. 1, will be described.

Referring to FIG. 1, the I/F circuit 114 acquires the user data and the logic address of the recording destination transmitted from the host apparatus 113. The user data is divided into data blocks of the units according to the standard format, to be sent to the error-correction encoder circuit 106 by each data block.

The error-correction encoder circuit 106 adds a parity code to correct errors during the reproduction, to the user data in units of the data block, and then, produces the encoded data.

The data modulator circuit 105 produces a modulated signal by modulating the pulse signal using the predetermined modulation rule, according to the encoded data having the parity code added thereto.

In order to accurately form a recording mark on the optical disc 100, the laser driving circuit 104 converts a pulse signal into a castle-type pulse waveform signal according to the modulated signal, and then, outputs a driving signal to drive the laser to the optical head 101.

The optical head 101 records the mark that corresponds to the modulated signal by irradiating a laser pulse to the position on the optical disc 100, where the position corresponds to the logic address of the recording destination.

The system controller 215 controls the recording operation. The system controller 115 determines the position to be recorded at on the optical disc 100 based on the logic address of the recording destination acquired by the I/F circuit 114, and moves the optical head 101 to the target position by controlling the servo controller 103. Before arriving at the track to be the target position, the system controller 115 instructs the operation in the standard format through the format selector circuit 112 to cause the error-correction encoder circuit 106 to operate. The data modulator circuit 105 also outputs the modulated signal in the recording format shown in FIG. 4 corresponding to the standard format according to the designation from the format selector circuit 112. At the time of arrival at the target position, the system controller 115 causes the data modulator circuit 105 and the laser driving circuit 104 to operate to record the data.

Figure 7:
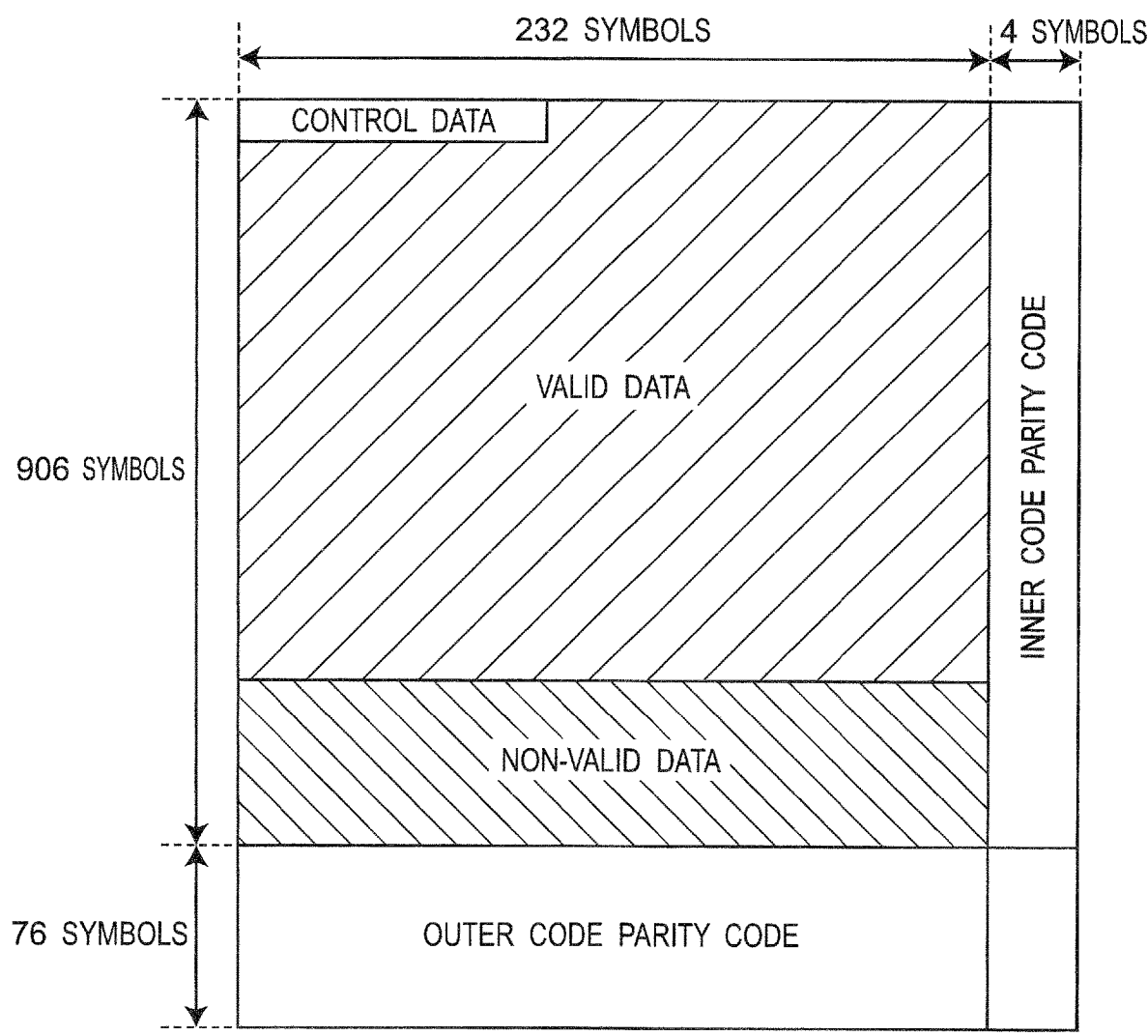
FIG. 7 is a format diagram of contents of recording data of the standard format of FIG. 3.

FIG. 7 is a format diagram of an example of the content of the encoded data in the standard format of the FIG. 3. As described above, the recorded data includes the user data of up to 262,144 bytes. When the user data transmitted from the host apparatus 113 through the I/F circuit 114 is smaller than 262,144 bytes, as shown in FIG. 7, the system controller 115 adds non-valid data whose value is zero for the insufficient portion. The recording data is set to have 262,144 bytes as a total of the valid data and the non-valid data. The control data includes the value of the amount of the valid data in the recording data in addition to the address information. In the case where the amount of the valid data has been known, and it has been known that the value of the non-valid data is zero, when the data blocks are reproduced, then no influence is received from any error symbol generated in the non-valid data, and the error-correction capability for the valid data can be enhanced. This will be described below in detail.

The valid data is recorded before-aligned from the head of the data block. When the amount of the valid data has been known, it can be known at which position in the data block the valid data is recorded and at which position therein the non-valid data is recorded. Because it has been known that the non-valid data is zero, even when any error is generated at the position of the non-valid data, any correction does not need to be executed using the parity code. Therefore, the parity code is substantially added only to the valid data. The error-correction capability can be enhanced because the parity code can be added to smaller data by reducing the amount of the valid data.

Before executing the recording of the user data, the track already recorded on the optical disc 100 is reproduced, or test recording is executed and reproduction is executed. In this case, the signal quality evaluator circuit 110 measures the MLSE index to evaluate the quality of the recording and the reproduction onto and from the optical disc 100. When the MLSE index indicates securing of an excellent quality determined in advance, the user data of 262,144 bytes to be the maximum is assigned as the valid data to the recording data of one data block. When the MLSE index indicates degradation of the quality, to handle with the errors increased by the degradation, the amount of the user data to be assigned to the recording data of one data block is reduced to be used as the valid data, and the rest is set to be the non-valid data. Concretely speaking, the system controller 115 make the following setting such that the amount of the user data to be assigned to one data block, that is, the amount of the valid data is reduced as the quality indicated by the MLSE index is lower. Based on this, the value of the reduced amount of the valid data is recorded as the control data.

The operation of recording data onto the track in the inner zone of the optical disc 100 of the optical disc apparatus 10 of FIG. 1 will be described.

In the inner zone, there are recorded the management information recorded therein to manage the status of the use of the track in the data zone, and the status of replacement or the like recorded in another track when a fault such as a scratch is present. The data amount of the management information is small, but the management information is indispensable information to records and reproduces the user data onto and from the optical disc 100. It is especially important also for the high-density optical disc 100 to secure the relatively high reproduction performance. Updating of the management information frequently occurs. Therefore, the length of the data block of the inner zone is advantageously short such that a large number of recording sessions associated with the updating of the management information can be secured. From these conditions, the shortened format shown in FIG. 5 is suitable whose redundancy degree is increased by setting the data block to be small for a small amount of recording data and by securing the parity of the error-correction code by the same amount as that of the standard format of the data zone.

In the inner zone, the management information produced by the system controller 115 is sent to the error-correction encoder circuit 106 through the I/F circuit 114.

The error-correction encoder circuit 106 forms the coded data by adding the parity code to correct any error generated during the reproduction, to the management information.

The data modulator circuit 105 produces the modulated signal by modulating the pulse signal using the predetermined modulation rule according to the encoded data having the parity code added thereto.

In order to accurately form the recording mark on the optical disc 100, the laser driving circuit 104 converts the modulated signal into the castle-type pulse waveform signal, and outputs the driving signal to drive the laser to the optical head 101.

The optical head 101 records the mark that corresponds to the modulated signal by irradiating the laser pulse to the position on the optical disc 100 at which the management information is recorded.

The system controller 115 controls the above recording operation. The system controller 115 determines the position, at which the management information is recorded on the optical disc 100, and controls the servo controller 103 to move the optical head 101 to the target position. Before arriving at the track to be the target position, the system controller 115 instructs the operation in the shortened format through the format selector circuit 112 to cause the error-correction encoder circuit 106 to operate. The data modulator circuit 105 also outputs the modulated signal in the recording format shown in FIG. 6 that corresponds to the shortened format according to the designation from the format selector circuit 112. When the optical head 101 arrives at the target position, the data modulator circuit 105 and the laser driving circuit 104 are caused to operate to record the data.

The reproduction operation of the optical disc apparatus 10 of FIG. 1 will be described.

The identification of the reproduction position for the optical disc 100 is same as the identification operation of the recording position in the recording operation in either the data zone or the inner zone. At the time for the position of the data block to be reproduced, the system controller 115 causes the reproduced signal decoder circuit 107, the data demodulator circuit 108, the error-correction decoder circuit 109, and the format selector circuit 112 to operate to reproduce the user data or the management information. In the data zone, the operation is executed according to the standard format shown in FIGS. 3 and 4. In the inner zone, the operation is executed according to the shortened format shown in FIGS. 5 and 6.

The reproduced signal decoder circuit 107 selects the expected value waveform that is the closest to the reproduced signal from the comparison between the reproduced signal and the expected value waveforms, and outputs a binary signal to be the source of the expected value waveform as the decoded signal.

The data demodulator circuit 108 demodulates the decoded signal into encoded data using the predetermined modulation rule and the error-correction decoder circuit 109 corrects errors in the demodulated encoded data to recover the user data or the management information.

In the data zone, the error-correction decoder circuit 109 first reads out the information on the amount of the valid data included in the control data. The error-correction decoder circuit 109 executes the error-correction process for the control data using the error-correction parity code for the control data, to acquire the information on the amount of the valid data. When the amount of the valid data is less than 262,144 bytes, as described in the example of FIG. 7, the value of the symbol corresponding to the non-valid data is set to be zero regardless of the output result of the data demodulator circuit 108, and thereafter, the error-correction process for the inner code and the outer code is started. Thus any error of the symbol corresponding to the non-valid data is corrected in advance, and the error-correction can effectively be executed for the errors of the symbol of the valid data.

As described above, in order to enhance the error-correction capability, the non-valid data (that has been known and therefore no error-correction is required therefor) needs to be known. Therefore, the amount of the valid data needs to be known in advance. In the sub-information including the amount of the valid data, the symbol error rate during the reproduction is also equal to that of any other data portion. In order to first accurately acquire the sub-information, desirably, the capability of the error-correction for the sub-information is further enhanced. Accordingly, the redundancy degree of the second error-correction code format is set to be higher than the redundancy degree of the first error-correction code format.

3. Advantageous Effects or the Like

As described above, according to the present embodiment, according to the optical disc 100 and the optical disc apparatus 10, stable recording and stable reproduction of data can be done even when the optical disc 100 having an increased track density and an increased line density is degraded, by controlling the amount of the data to be in a range that enables the error-correction. Very high reproduction performance can be secured for the management information indispensable for the recording and reproduction of the optical disc 100 by using the shortened format having an increased redundancy degree.

This disclosure can be applied to an optical disc and an optical disc apparatus that records and reproduces data.

What is claimed is:

1. An optical disc apparatus that records and reproduces data onto and from an optical disc, the optical disc including a first space into which user data is recorded, and a second space into which management information different from the user data is recorded in units of a predetermined block, the optical disc apparatus comprising:
   an error-correction encoder circuit that error-correction-encodes the user data in units of a first block in the first space, and error-correction-encodes the management information in units of a second block, the unit of the second block having a second length shorter than a first length of the unit of the first block, and the unit of the second block having a redundancy degree higher than a redundancy degree of the unit of the first block; and
   a recorder that converts the error-correction-encoded user data or management information into a recording signal, and records the recording signal into the optical disc,
   wherein the management information records a status of replacement and is updated after a fault of a track is detected,
   wherein the second space into which the management information is recorded is located within a circumferential region of the optical disc,
   wherein the first space into which the user data is recorded is located outside the circumferential region of the optical disc,
   wherein the second length of the unit of the second block is equal to the first length of the unit of the first block divided by a power of two, and
   wherein the user data is spirally recorded following the management information.

2. An optical disc which user data and management information are recorded into and reproduced from, the optical disc comprising:
   a first space, which the user data error-correction-encoded in units of a first block is recorded into and reproduced from; and
   a second space, which the management information is recorded into, the management information being error-correction-encoded in units of a second block, the unit of the second block having a second length shorter than a first length of the unit of the first block, and the unit of the second block having a redundancy degree higher than a redundancy degree of the unit of the first block, wherein the management information records a status of replacement and is updated after a fault of a track is detected, wherein the second space into which the management information is recorded is located within a circumferential region of the optical disc, wherein the first space into which the user data is recorded is located outside the circumferential region of the optical disc, wherein the second length of the unit of the second block is equal to the first length of the unit of the first block divided by a power of two, and wherein the user data is spirally recorded following the management information.

3. The optical disc apparatus according to claim 1, wherein the second length of the unit of the second block is equal to one-eighth the first length of the unit of the first block.

4. The optical disc according to claim 2, wherein the second length of the unit of the second block is equal to one-eighth the first length of the unit of the first block.

* * * * *